US009525040B2

(12) United States Patent
Zhu et al.

(10) Patent No.: US 9,525,040 B2
(45) Date of Patent: Dec. 20, 2016

(54) METHOD OF FABRICATING HYBRID IMPACT-IONIZATION SEMICONDUCTOR DEVICE

(71) Applicant: Taiwan Semiconductor Manufacturing Company, Ltd., Hsin-Chu (TW)

(72) Inventors: Ming Zhu, Singapore (SG); Lee-Wee Teo, Singapore (SG); Harry Hak-Lay Chuang, Crescent (SG)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 44 days.

(21) Appl. No.: 14/188,181

(22) Filed: Feb. 24, 2014

(65) Prior Publication Data

US 2014/0170820 A1    Jun. 19, 2014

Related U.S. Application Data

(62) Division of application No. 12/725,081, filed on Mar. 16, 2010, now Pat. No. 8,680,619.

(51) Int. Cl.
| | |
|---|---|
| *H01L 21/336* | (2006.01) |
| *H01L 29/66* | (2006.01) |
| *H01L 29/423* | (2006.01) |
| *H01L 29/739* | (2006.01) |
| *H01L 21/8238* | (2006.01) |

(52) U.S. Cl.
CPC . *H01L 29/66484* (2013.01); *H01L 21/823807* (2013.01); *H01L 29/423* (2013.01); *H01L 29/7391* (2013.01)

(58) Field of Classification Search
CPC .......... H01L 21/823807; H01L 29/423; H01L 29/66484; H01L 29/7391
See application file for complete search history.

(56) References Cited

U.S. PATENT DOCUMENTS

| | | | |
|---|---|---|---|
| 6,255,698 B1 * | 7/2001 | Gardner | ............ H01L 21/82384 257/369 |
| 8,154,055 B2 * | 4/2012 | Ha | ..................... H01L 27/14632 257/204 |
| 2002/0109153 A1 | 8/2002 | Ker et al. | |
| 2003/0111681 A1 * | 6/2003 | Kawanaka | ............ G11C 11/405 257/296 |
| 2005/0035410 A1 | 2/2005 | Yeo et al. | |
| 2006/0065939 A1 | 3/2006 | Doczy et al. | |
| (Continued) | | | |

OTHER PUBLICATIONS

Fontaine, G., "Diodes and Transistors", General Principles, Jun. 1963, 470 pps, Philips Technical Library.

(Continued)

*Primary Examiner* — Meiya Li
(74) *Attorney, Agent, or Firm* — Haynes and Boone, LLP

(57) ABSTRACT

A method includes providing a semiconductor substrate having an active region and forming an isolation structure to isolate the active region. First and second gate structures are formed over the active region. First and second doped regions are formed within the active region of the substrate, the first doped region has a first conductivity type, the second doped region has the second conductivity type. The first and second gate structures are interposed between the first and second doped regions.

20 Claims, 15 Drawing Sheets

P-channel IMOS

N-channel IMOS

(56) References Cited

U.S. PATENT DOCUMENTS

2007/0250012 A1\* 10/2007 Lu .................... A61B 17/32056
604/168.01

OTHER PUBLICATIONS

Cao, Shuqing, "ESD Design Challenges and Strategies in Deeply-Scaled Integrated Circuits", Aug. 2010, 137 pps., This dissertation is online at: http://purl.stanford.edu/mr612pv6371.

\* cited by examiner

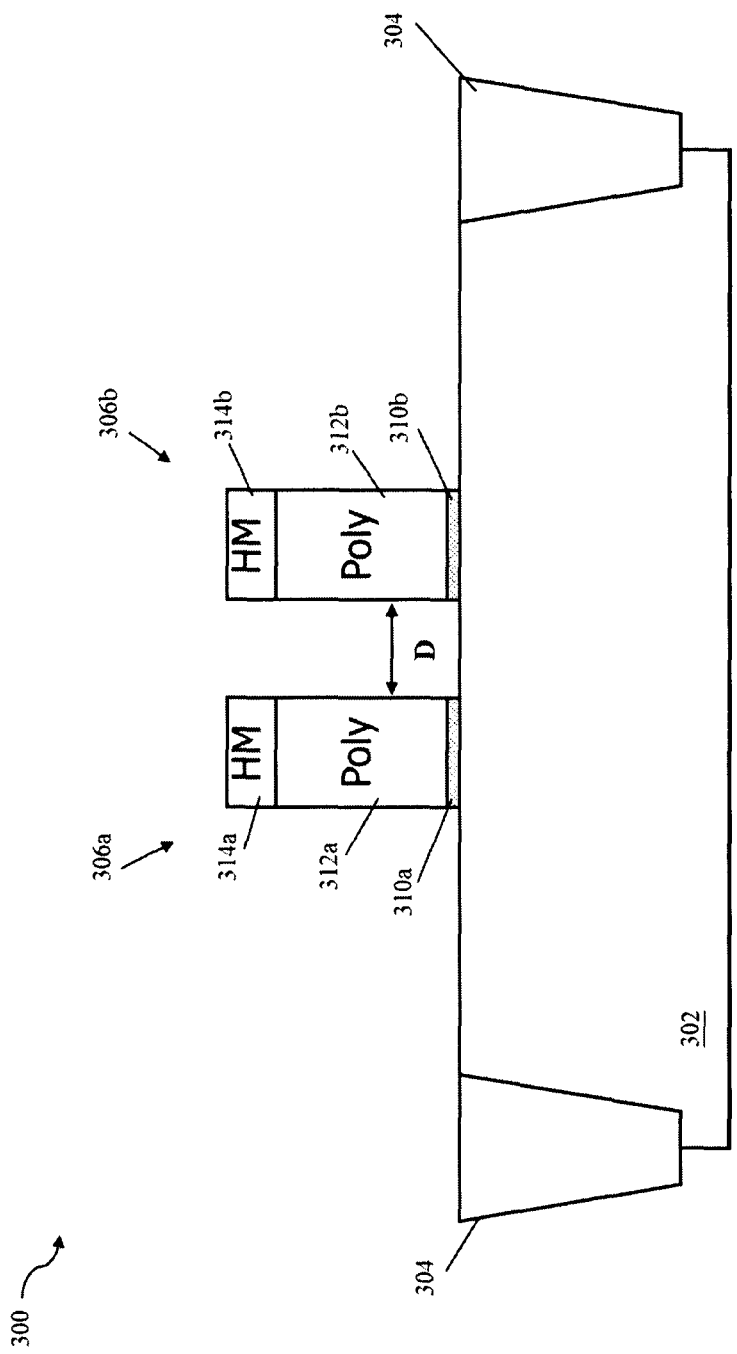

METHOD OF FABRICATING HYBRID IMPACT-IONIZATION SEMICONDUCTOR DEVICE

CROSS REFERENCE TO RELATED APPLICATIONS

The present application is a divisional of U.S. Utility application Ser. No. 12/725,081 filed Mar. 16, 2010, the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e. the number of interconnected devices per chip area) has generally increased while geometry size (i.e. the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease.

However, the scaling of CMOS devices faces challenges of rapid increase in power consumption. Impact-ionization MOS (IMOS) devices are a promising candidate for enabling further scaling of power supply voltage without an increase of an off-state leakage current due to its sub-60 mV/dec subthreshold swing. Therefore, what is desired is a method of fabricating a IMOS device utilizing high-k dielectric metal gate technology.

SUMMARY

One of the broader forms of an embodiment of the invention involves a semiconductor device. The semiconductor device includes a semiconductor substrate; a first gate structure disposed over the substrate, the first gate structure including a first gate electrode of a first conductivity type; a second gate structure disposed over the substrate and proximate the first gate structure, the second gate structure including a second gate electrode of a second conductivity type different from the first conductivity type; a first doped region of the first conductivity type disposed in the substrate, the first doped region including a first portion aligned with a side of the first gate structure; and a second doped region of the second conductivity type disposed in the substrate, the second doped region including a second portion aligned with a side of the second gate structure.

Another one of the broader forms of an embodiment of the invention involves a method for fabricating a semiconductor device. The method includes providing a semiconductor substrate having an active region; forming an isolation structure to isolate the active region; orming first and second gate structures over the active region of the substrate, the first gate structure including a first gate electrode of a first conductivity type, the second gate structure including a second gate electrode of a second conductivity type different from the first conductivity; and forming first and second doped regions within the active region of the substrate, the first doped region having the first conductivity type, the second doped region having the second conductivity type. The first and second gate structures are interposed between the first and second doped regions.

Yet another one of the broader forms of an embodiment of the invention involves a semiconductor device. The semiconductor device includes a semiconductor substrate having an active region; an isolation structure for isolating the active region; first and second gate structures disposed over the active region of the substrate, the first gate structure including a first gate electrode of a first conductivity type, the second gate structure including a second gate electrode of a second conductivity type different from the first conductivity type; and first and second doped regions disposed within the active region of the substrate, the first doped region having the first conductivity type, the second doped region having the second conductivity type. The first and second gate structures are interposed between the first and second doped regions.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3-12 are cross-sectional views of a hybrid semiconductor device at various stages of fabrication according to the method of FIGS. 2A and 2B.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In addition, the present disclosure provides examples of fabricating a semiconductor device in a "gate last" process, however one skilled in the art may recognize applicability to other processes and/or use of other materials.

Figure 1:
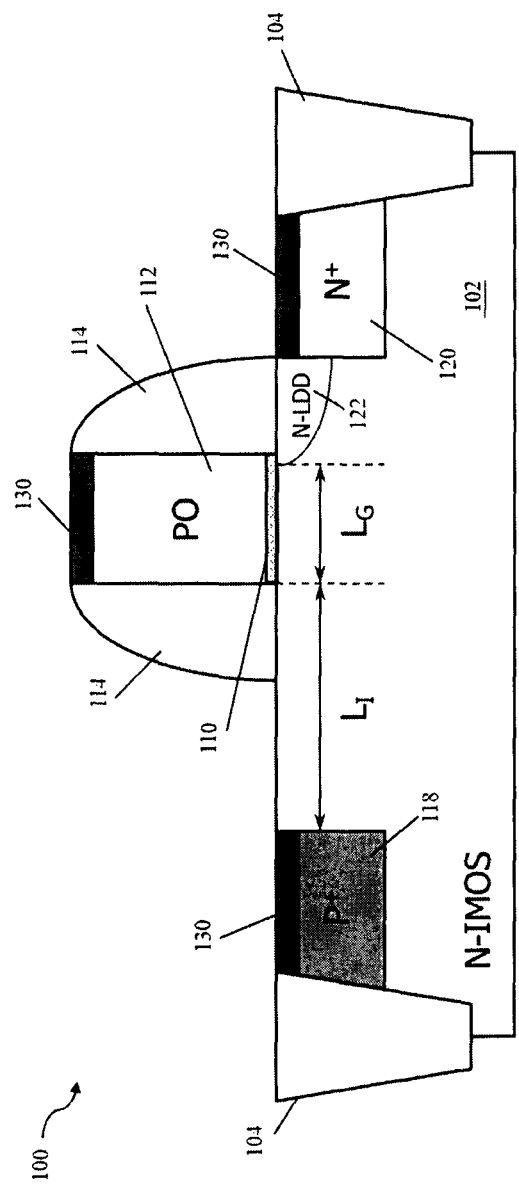
FIG. 1 is a cross-sectional view of a conventional impact-ionization metal oxide semiconductor (IMOS) device.

Referring to FIG. 1, illustrated is a conventional impact-ionization metal oxide semiconductor (IMOS) device 100. The IMOS device 100 is configured as an n-type (n-channel) IMOS field effect transistor. The IMOS device 100 includes a semiconductor substrate 102 such as a silicon substrate. The IMOS device 100 may be isolated from other devices by an isolation structure 104 such as a shallow trench isolation (STI). The IMOS device 100 further includes a gate structure having a gate dielectric 110 and a gate electrode 112. The gate dielectric 110 may include a gate oxide or other suitable dielectric layer. The gate electrode 112 may include a doped polysilicon (poly). The IMOS device 100 further includes spacers 114 disposed on sidewalls of the gate structure. The IMOS device 100 further includes a source region 118 and a drain region 120. The source region 118 includes a heavily doped region of p-type dopants (P+) such as boron. The drain region 120 includes a heavily doped region of n-type dopants (N+) such as phosphorous or arsenic. The drain region 120 further includes a lightly doped region 122 of n-type dopants (nLDD) such as phosphorous or arsenic. Silicide features 130 are formed on the gate electrode 112, source region 118, and drain region 120.

The operation of the IMOS device 100 is known and thus only briefly discussed herein. The IMOS device 100 includes a channel region having a gate length ($L_{gate}$) and an intrinsic region (I-region) having an intrinsic length ($L_I$). The gate electrode 112 is coupled to a gate voltage ($V_g$), the source region 118 is coupled to a source voltage ($V_s$), and the drain region 120 is coupled to a drain voltage ($V_d$). At a low $V_g$ (i.e. less than a threshold voltage $V_{th}$), a lateral electric field is below breakdown as a fraction of $V_{ds}$ gets applied across the I-region outside the gate. The current is limited by the reverse leakage current of the P-I-N diode (off-state). With an increasing $V_g$, an increasing fraction of $V_{ds}$ falls across the I-region, and thus increases the lateral electric field. When $V_g$ reaches a certain value (i.e. greater than a threshold voltage $V_{th}$), impact ionization leads to avalanche breakdown in the I-region and a large amount of electron-hole pairs are generated due to this self-amplfying avalanche effect which results in a rapid increase in current flowing between the source 118 and drain 120 (on-state). Accordingly, the IMOS device 100 is a promising candidate that enable further scaling of power supply voltage without increasing the off-state leakage current due to its sub-60 mV/dec subthreshold swing. However, there have been challenges with fabricating this type of device as feature sizes continue to shrink. For example, overlay control to pattern the mask to define the P+ region becomes more difficult. Additionally, more challenges are present in forming an asymmetric device structure as compared to a symmetric device structure.

Referring to FIG. 2, illustrated is a flowchart of a method 200 for fabricating a hybrid semiconductor device according to various aspects of the present disclosure. The method 200 begins with block 202 in which a semiconductor substrate is provided. The substrate includes an active region. The method 200 continues with block 204 in which an isolation structure is formed to isolate the active region of the substrate. The method 200 continues with block 206 in which first and second gate structures are formed over the active region of the substrate. The first and second gate structures include first and second dummy gates, respectively. The method 200 continues with block 208 in which a first mask is formed to protect the first gate structure and a portion of the second gate structure. The method 200 continues with block 210 in which a first implantation process is performed on the substrate to form a lightly doped region aligned with a sidewall of the second gate structure. The method 200 continues with block 212 in which the first mask is removed.

The method 200 continues with block 214 in which a second mask is formed to protect the second gate structure and a portion of the first gate structure. The method 200 continues with block 216 in which a second implantation process is performed on the substrate to form a lightly doped region aligned with a sidewall of the first gate structure. The method 200 continues with block 218 in which the second mask is removed. The method 200 continues with block 220 in which spacers are formed on sidewalls of the first and second gate structures, respectively. The method 200 continues with block 222 in which a third mask is formed to protect the first gate structure and the portion of the second gate structure. The method 200 continues with block 224 in which a third implantation process is performed on the substrate to form a heavily doped region aligned with the spacer formed on the sidewall of the second gate structure. The method 200 continues with block 226 in which the third mask is removed.

The method 200 continues with block 228 in which a fourth mask is formed to protect the second gate structure and the portion of the first gate structure. The method 200 continues with block 230 in which a fourth implantation process is performed on the substrate to form a heavily doped region aligned with the spacer formed on the sidewall of the first gate structure. The method 200 continues with block 232 in which the fourth mask is removed. The method 200 continues with block 234 in which an inter-level dielectric (ILD) is formed over the substrate. The method 200 continues with block 236 in which a chemical mechanical polishing (CMP) is performed on the ILD thereby exposing the first and second dummy gate structures. The method 200 continues with block 238 in which the first dummy gate structure is replaced with a first metal gate electrode. The method 200 continues with block 240 in which the second dummy gate structure is replaced with a second metal gate electrode. The method 200 continues with block 242 in which fabrication of the semiconductor device is completed. The discussion that follows illustrates various embodiments of a hybrid semiconductor device that can be fabricated according to the method 200 of FIGS. 2A and 2B.

Figure 2A:
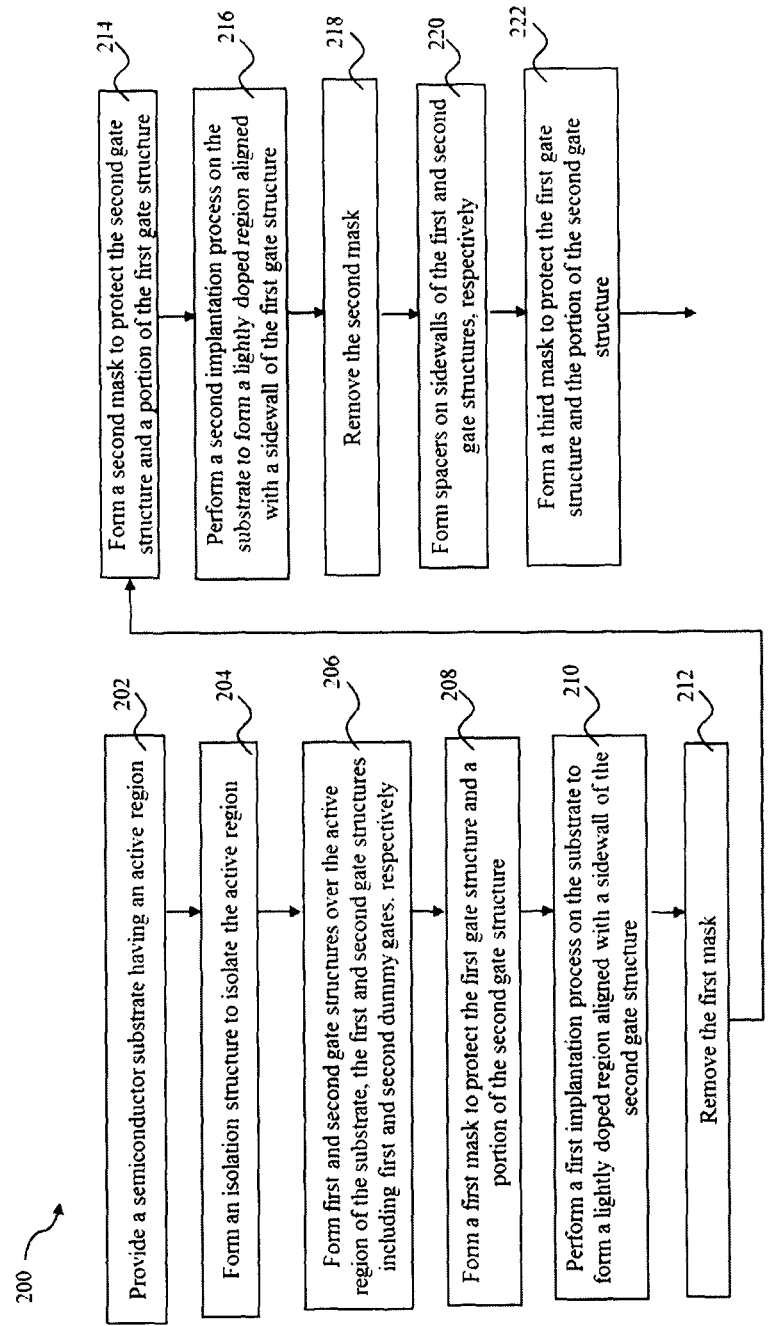
FIGS. 2A and 2B is a flowchart illustrating a method for fabricating a hybrid semiconductor device with according to various aspects of the present disclosure.
Figure 2B:
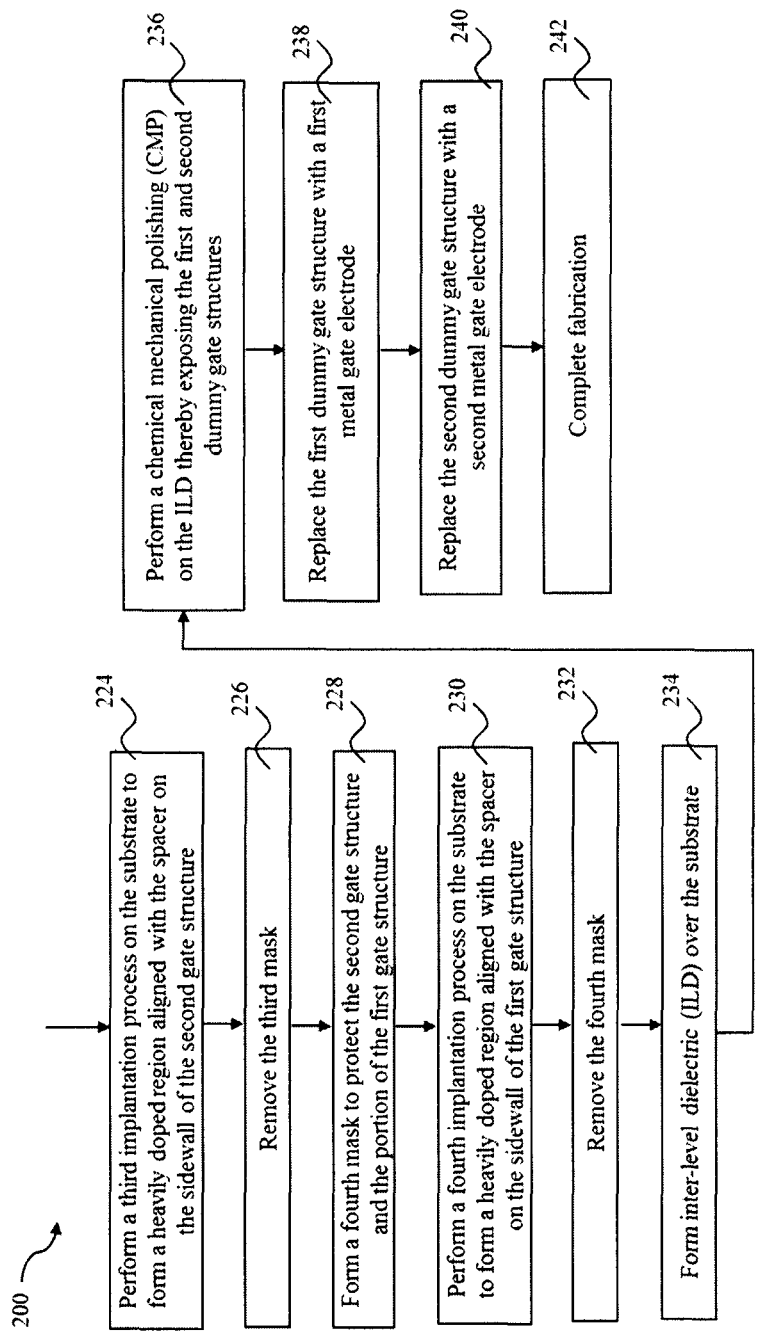

Referring to FIGS. 3-12, illustrated are cross-sectional views of a hybrid semiconductor device 300 at various stages of fabrication according to the method 200 of FIGS. 2A and 2B. It should be noted that part of the semiconductor device 300 may be fabricated with a CMOS process flow. Accordingly, it is understood that additional processes may be provided before, during, and after the method 200 of FIGS. 2A and 2B, and that some other processes may only be briefly described herein. It is understood that FIGS. 3 to 12 have been simplified for the sake of clarity to better understand the inventive concepts of the present disclosure. In the present embodiment, the semiconductor device 300 may be fabricated in a gate last process (also referred to as a gate replacement process).

In FIG. 3, the semiconductor device 300 includes a semiconductor substrate 302. The substrate 302 includes a semiconductor wafer such as a silicon wafer. The substrate 302 may include various doped regions such as P-wells and N-wells. In some embodiments, the substrate 302 may include other elementary semiconductors such as germanium. The substrate 302 may also include a compound semiconductor such as silicon carbide, gallium arsenic, indium arsenide, and indium phosphide. The substrate 302 may include an alloy semiconductor such as silicon germanium, silicon germanium carbide, gallium arsenic phosphide, and gallium indium phosphide. In one embodiment, the substrate 302 includes an epitaxial layer (epi layer) overlying a bulk semiconductor. Furthermore, the substrate 302 may include a semiconductor-on-insulator (SOI) structure. In various embodiments, the substrate 302 may include a buried layer such as an N-type buried layer (NBL), a P-type buried layer (PBL), and/or a buried dielectric layer including a buried oxide (BOX) layer.

Isolation structures 304 such as shallow trench isolation (STI) or local oxidation of silicon (LOCOS) are formed in the substrate 302 to define and electrically isolate various active regions. As one example, the formation of an STI feature may include dry etching a trench in a substrate and filling the trench with insulator materials such as silicon oxide, silicon nitride, or silicon oxynitride. The filled trench may have a multi-layer structure such as a thermal oxide liner layer filled with silicon nitride or silicon oxide. In furtherance of the embodiment, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with oxide, using chemical mechanical polishing (CMP) processing to etch back and planarize, and using a nitride stripping process to remove the silicon nitride.

The semiconductor device 300 further includes gate structures 306a, 306b formed over the substrate 302. The formation of the gate structures 306a, 306n includes forming various material layers, and etching/patterning the various material layers to form the gate structures. The gate structures 306a, 306b are spaced a distance D ranging from about 45 nm to about 55 nm.

The gate structures 306a, 306b include an interfacial layer (not shown) formed over the substrate 302. The interfacial layer may include a silicon oxide ($SiO_2$) layer (e.g., thermal or chemical oxide formation) having a thickness ranging from about 5 to about 20 angstrom (Å). Alternatively, the interfacial layer may optionally include HfSiO or SiON formed by atomic layer deposition (ALD), chemical vapor deposition (CVD), physical vapor deposition (PVD), thermal oxidation, or combinations thereof.

The gate structures 306a, 306b further include a high-k dielectric layer 310a, 310b formed on the interfacial layer. The high-k dielectric layer 310a, 310b may be formed by ALD, CVD, metalorganic CVD (MOCVD), PVD, thermal oxidation, combinations thereof, or other suitable techniques. The high-k dielectric layer 310a, 310b may include a thickness ranging from about 5 to about 20 angstrom (Å). The high-k dielectric layer 310a, 310b may include a binary or ternary high-k film such as $HfO_x$. Alternatively, the high-k dielectric layer 310a, 310b may optionally include other high-k dielectrics such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfSiO, $(Ba,Sr)TiO_3$ (BST), $Al_2O_3$, $Si_3N_4$, oxynitrides, or other suitable materials.

The gate structures 306a, 306b may further include a barrier layer (not shown) formed over the high-k dielectric layer 310a, 310b. The barrier layer may include a metal film such as TiN or TaN. Alternatively, the barrier layer may optionally include $Si_3N_4$. The barrier layer may include a thickness ranging from about 5 to about 20 angstrom (Å). The barrier layer may function as a barrier between the high-k dielectric layer and a subsequent dummy poly gate structure. The barrier layer may help reduce or eliminate the risk of Fermi level pinning between the poly and the high-k dielectric during subsequent processing. Also, the barrier layer may function as a etch stop layer and protection layer during removal of the dummy poly gate as discussed later below. The barrier layer may be formed by various deposition techniques such as ALD, PVD, CVD, or other suitable technique.

The gate structures 306a, 306b may further include a polysilicon (or poly) layer 312a, 312b formed over the high-k dielectric layer 310a, 310b, respectively, by a suitable deposition process. For example, silane ($SiH_4$), di-silane ($Si_2H_6$), or di-clorsilane ($SiCl_2H_4$) may be used as a chemical gas in a CVD process to form the poly layer 312a, 312b. The poly layer 312a, 312b may be referred to as a dummy poly layer since it will be replaced with a metal gate electrode as will be discussed below. The poly layer 312a, 312b may include a thickness ranging from about 200 to about 2000 angstrom (Å). Alternatively, an amorphous silicon layer may optionally be formed instead of the polysilicon layer.

The gate structures 306a, 306b may further include a hard mask layer 314a, 314b formed on the poly layer 312a, 312b, respectively. The hard mask layer 314a, 314b may include silicon oxide, silicon nitride, silicon oxynitride, silicon carbide, and/or other suitable dielectric materials, and may be formed using a method such as CVD or PVD. The hard mask layer 314a, 314b may include a thickness ranging from about 100 to about 400 angstrom (Å). Additionally, an antireflective coating layer or bottom antireflective coating (BARC) layer may be used to enhance a photolithography process for patterning a photoresist layer.

One exemplary method for patterning the gate structures 306a, 306b is described below. A layer of photoresist is formed on the hard mask layer by a suitable process, such as spin-on coating, and then patterned to form a patterned photoresist feature by a proper lithography patterning method. The patterned photoresist layer is formed on the hard mask layer. The pattern of the photoresist layer is transferred to the hard mask layer and then transferred to the polysilicon layer and the high-k dielectric layer to form the gate structures. It is noted that the gate structures 306a, 306b may include a sealing layer or other suitable layer formed on the side walls of the gate structures.

Figure 4:
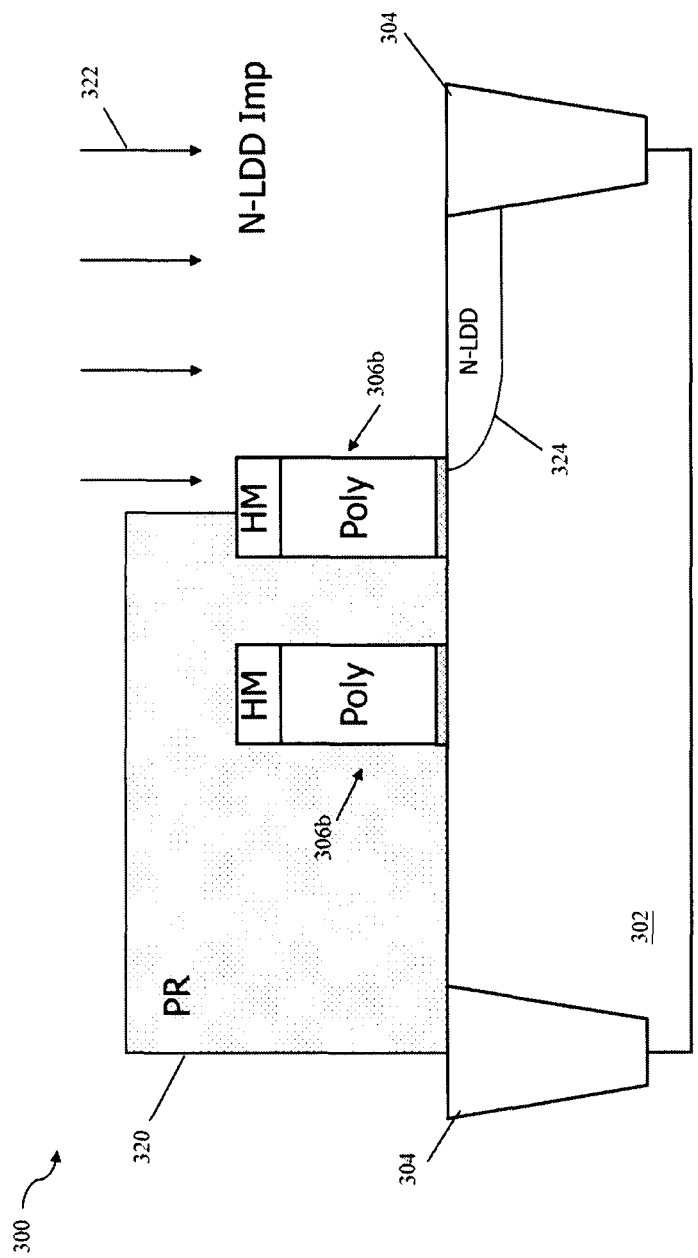

In FIG. 4, the semiconductor device 300 further includes a lightly doped region 324 of an n-type (referred to as nLDD region) formed in the substrate 302. It is understood that an integrated circuit (IC) chip of the semiconductor device 300 may include various microelectronic devices such as core NMOS and PMOS devices (not shown) formed in other active regions of the substrate 302. Accordingly, the lightly doped region 324 may be formed concurrently (same stage) with formation of lightly doped regions of an n-type (nLDD) in the other active regions of the substrate 302 for the core NMOS devices. A patterned photoresist layer 320 is formed by a proper lithography patterning method. The photoresist layer 320 protects a portion of the substrate 302, the gate structure 306a, and a portion of the gate structure 306b. Another portion of the substrate 302 is exposed between a sidewall of the gate structure 306b and the STI 304. An ion implantation process 322 is performed to implant n-type dopants, such as phosphorous or arsenic, into the exposed portion of the substrate 302 thereby forming the lightly doped region 324. In an embodiment, the ion implantation process 322 utilizes an energy ranging from about 3 to about 5 KeV, a dosage ranging from about 5E14 to about 2E15 atoms/cm$^2$, and a tilt angle ranging from about 0 to about 7 degree. The lightly doped region 324 includes an edge substantially self-aligned with a sidewall of the gate structure 306b. In other embodiments, the nLDD regions may be formed by diffusion.

Figure 5:
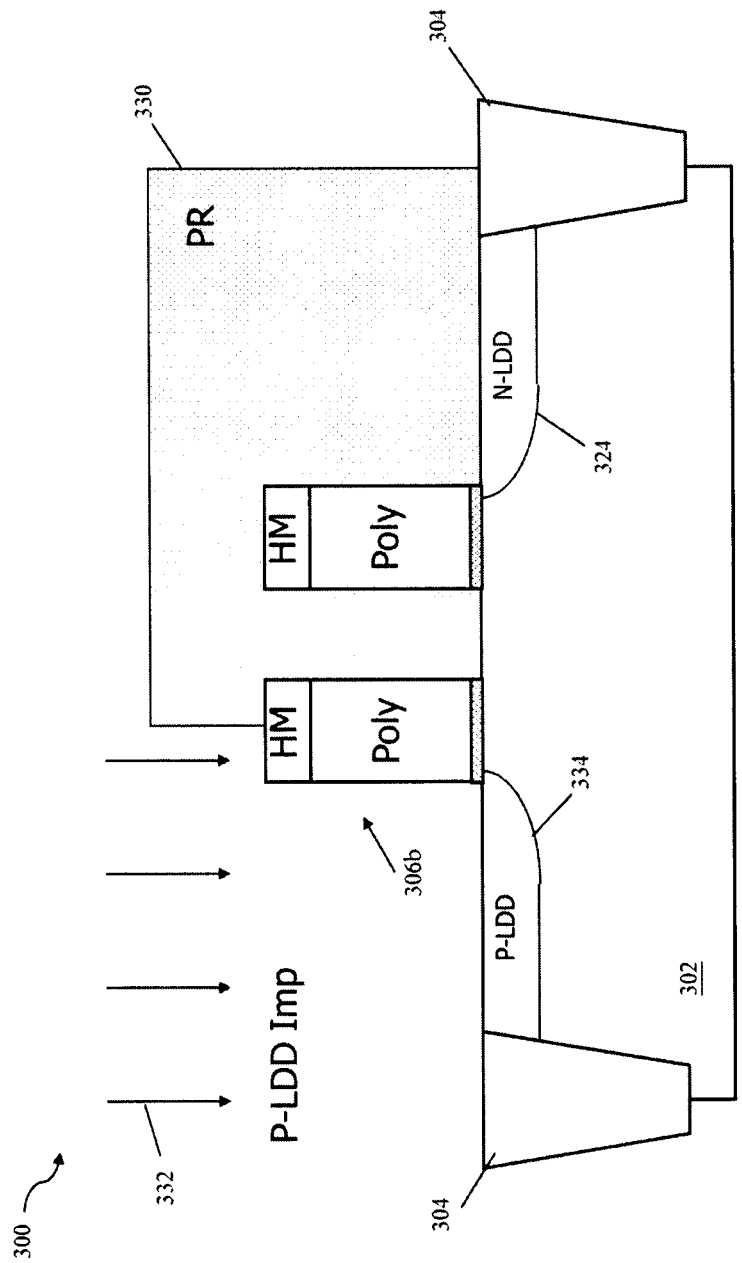

In FIG. 5, the semiconductor device 300 further includes a lightly doped region 334 of a p-type (referred to as pLDD region) formed in the substrate 302. As noted above, the IC chip of the semiconductor device 300 may include core PMOS devices (not shown) formed in other active regions of the substrate 302. Accordingly, the lightly doped region 334 may be formed concurrently (same stage) with formation of lightly doped regions of a p-type (pLDD) in the other active regions of the substrate 302 for the core PMOS devices. A patterned photoresist layer 330 is formed by a proper lithography patterning method. The photoresist layer 330 protects a portion of the substrate 302, the gate structure 306b, and a portion of the gate structure 306a. Another portion of the substrate 302 is exposed between a sidewall of the gate structure 306a and the STI 304. An ion implantation process 332 is performed to implant p-type dopants, such as boron or BF$_2$, into the exposed portion of the substrate 302 thereby forming the lightly doped region 334. In an embodiment, the ion implantation process 332 utilizes an energy ranging from about 3 to about 5 KeV, a dosage ranging from about 5E14 to about 2E15 atoms/cm$^2$, and a tilt angle ranging from about 0 to about 7 degree. The lightly doped region 334 includes an edge substantially self-aligned with a sidewall of the gate structure 306a. In other embodiments, the nLDD regions may be formed by diffusion.

Figure 6:
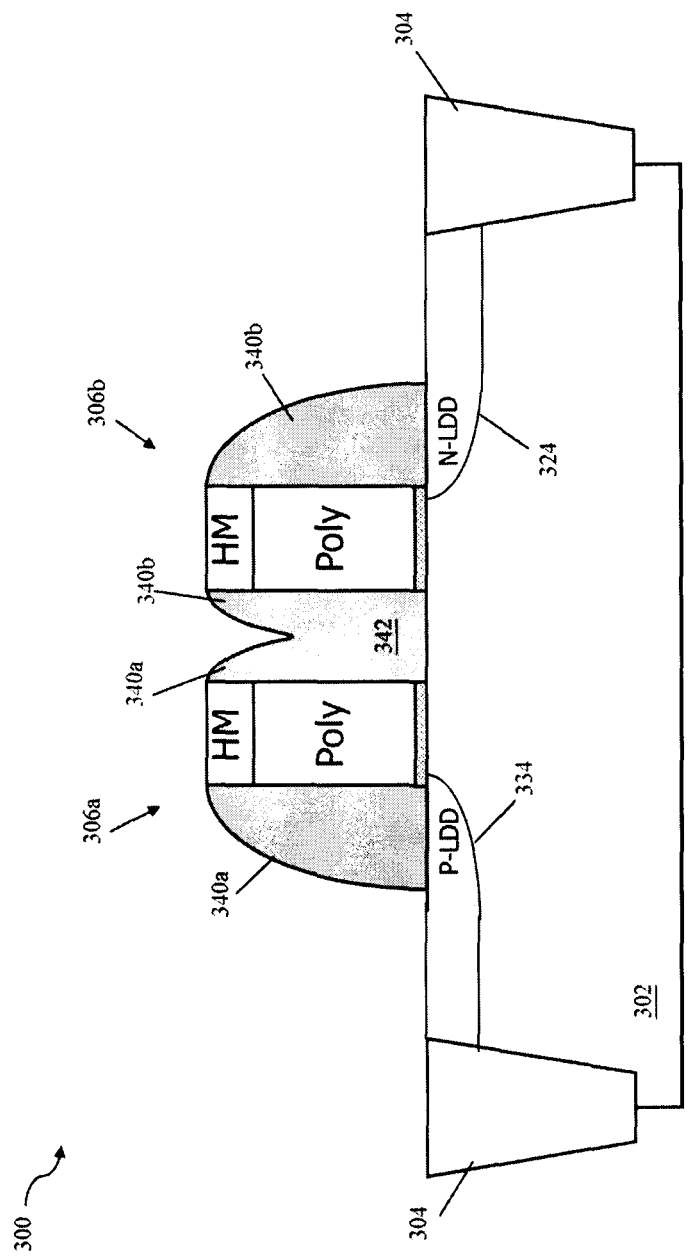

In FIG. 6, the semiconductor device 300 further includes sidewall spacers 340a, 340b formed on the sidewalls of the gate structures 306a, 306b, respectively. The sidewall spacers 340a, 340b may include a dielectric material such as silicon oxide. Alternatively, the sidewall spacers 340a, 340b may optionally include silicon nitride, silicon carbide, silicon oxynitride, or combinations thereof. In some embodiments, the sidewall spacers 340a, 340b may have a multi-layer structure. The sidewall spacers 340a, 340b may be formed by a known deposition and etching (anisotropic etching technique). It is noted that the sidewalls spacers 340a, 340b have sufficient thickness such that the sidewall spacers 340a, 340b disposed on opposing sidewalls of the gate structures 306a, 306b are merged 342 due to the small spacing D between the gate structures 306a, 306b. Accordingly, the merged sidewall spacers 342 protect a portion of the substrate 302 directly underlying the region between the gate structures 306a, 306b. The merged sidewall spacers 342 will protect the underlying substrate 302 during a salicidation process as will be discussed below.

Figure 7:
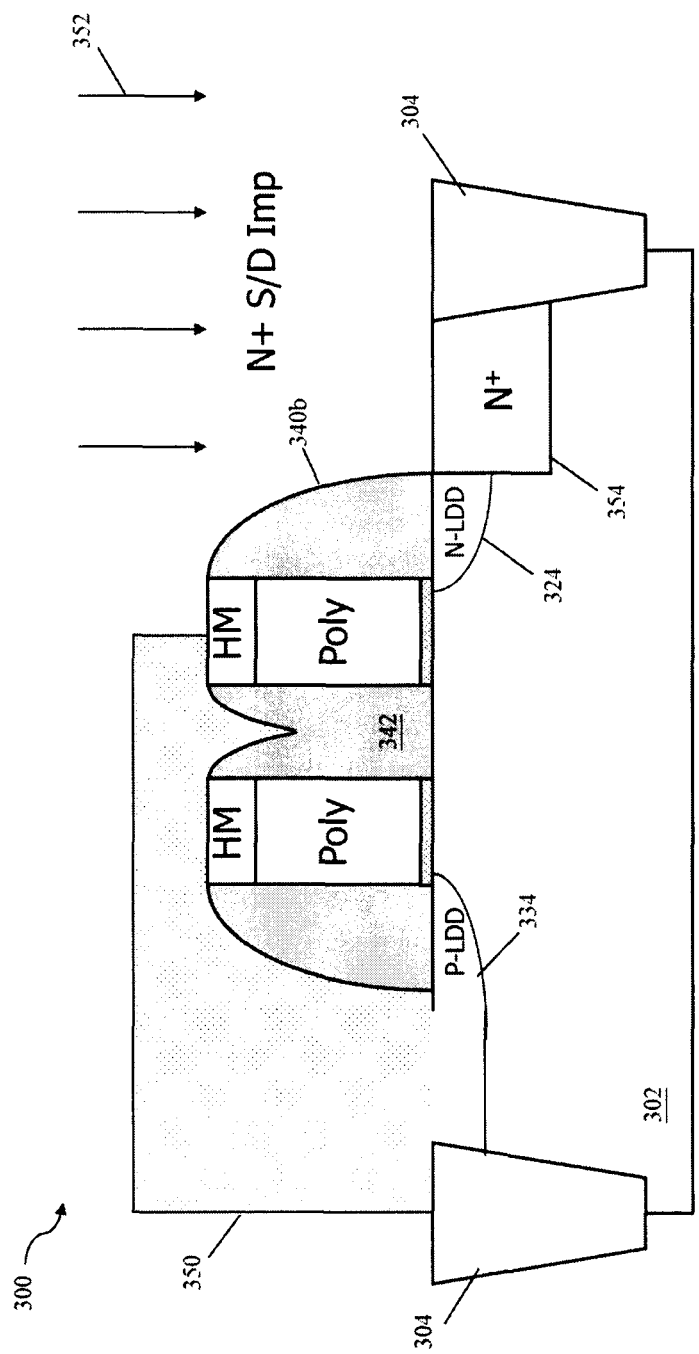

In FIG. 7, the semiconductor device 300 further includes a heavy doped region 354 of an n-type (referred to as N+ region) formed in the substrate 302. As noted above, the IC chip of the semiconductor device 300 may include core NMOS devices in other active regions of the substrate 302. Accordingly, the heavy doped region 354 may be formed concurrently (same stage) with formation of source/drain (S/D) regions of an n-type for the core NMOS devices. A patterned photoresist layer 350 is formed by a proper lithography patterning method. The photoresist layer 350 may be similar to the photoresist layer 330 that was utilized for the formation of the lightly doped region 334. Accordingly, the photoresist layer 350 protects a portion of the substrate 302, the gate structure 306a, and a portion of the gate structure 306b. Another portion of the substrate 302 is exposed between the sidewall spacer 340b and the STI 304. An ion implantation process 352 is performed to implant n-type dopants, such as phosphorous or arsenic, into the exposed portion of the substrate 302 thereby forming the heavy doped region 324. In an embodiment, the ion implantation process 352 utilizes an energy ranging from about 3 to about 15 KeV, a dosage ranging from about 1E15 to about 5E15 atoms/cm$^2$, and a tilt angle of about 0 degree. The heavy doped region 354 includes an edge that is substantially self-aligned with the sidewall spacer 340b of the gate structure 306b. In other embodiments, the S/D regions may be formed by diffusion. In various embodiments, the S/D regions may have different doping profiles formed by multi-process implantation. It is noted that the heavy doped region 354 may function as either a source or a drain depending on a bias configuration as will be discussed below.

Figure 8:
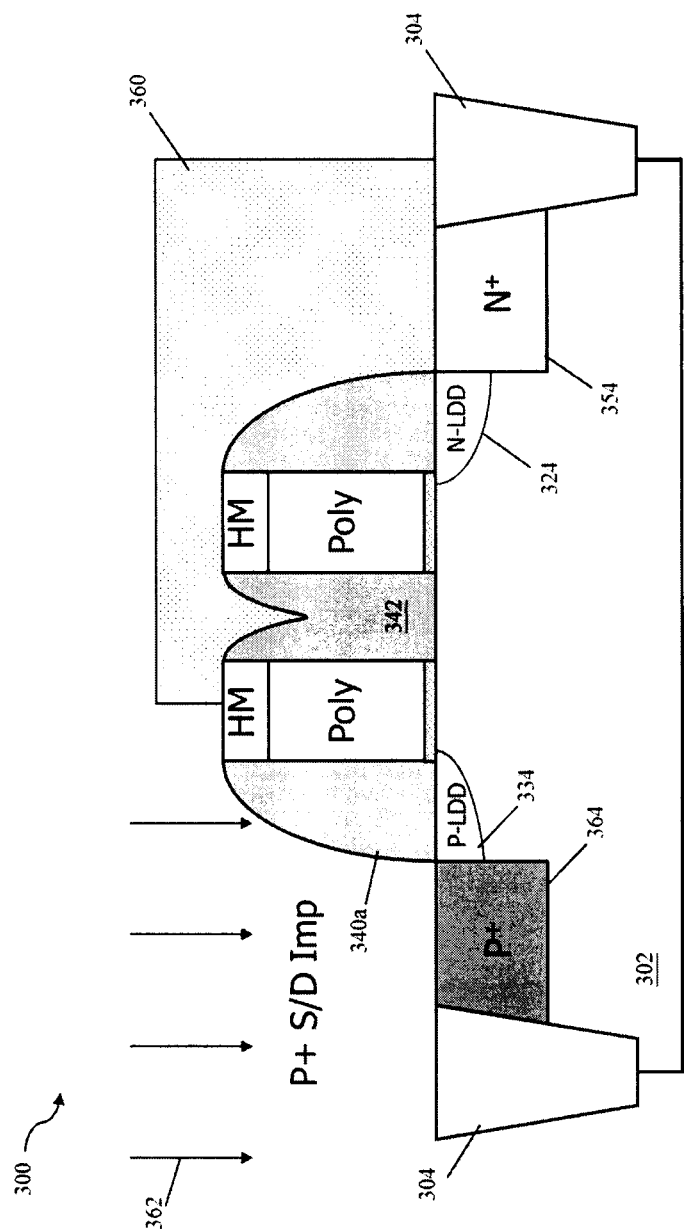

In FIG. 8, the semiconductor device 300 further includes a heavy doped region 364 of a p-type (referred to as P+ region) formed in the substrate 302. As noted above, the IC chip of the semiconductor device 300 may include core PMOS devices in other active regions of the substrate 302. Accordingly, the heavy doped region 364 may be formed concurrently (same stage) with formation of source/drain (S/D) regions of a p-type for the core PMOS devices. A patterned photoresist layer 360 is formed by a proper lithography patterning method. It is noted that overlay control to pattern the photoresist layer 360 is more relaxed (i.e. larger process window) since the opening does not have to be precisely patterned to define the P+ region as compared to the conventional device of FIG. 1. The photoresist layer 360 may be similar to the photoresist layer 340 that was utilized for the formation of the lightly doped region 344. Accordingly, the photoresist layer 360 protects a portion of the substrate 302, the gate structure 306b, and a portion of the gate structure 306a. Another portion of the substrate 302 is exposed between the sidewall spacer 340a and the STI 304. An ion implantation process 362 is performed to implant p-type dopants, such as boron or BF$_2$, into the exposed portion of the substrate 302 thereby forming the heavy doped region 364. In an embodiment, the ion implantation process 362 utilizes an energy ranging from about 3 to about 6 KeV, a dosage ranging from about 1E15 to about 3E15 atoms/cm$^2$, and a tilt angle of about 0 degree. The heavy doped region 364 includes an edge that is substantially self-aligned with the sidewall spacer 340a of the gate structure 306a. In other embodiments, the S/D regions may be formed by diffusion. A rapid thermal annealing (RTA) process may be used to activate the implanted dopant. In various embodiments, the source and drain regions may have different doping profiles formed by multi-process implantation. It is noted that the heavy doped region 354 may function as either a source or a drain depending on a bias configuration as will be discussed below.

Figure 9:
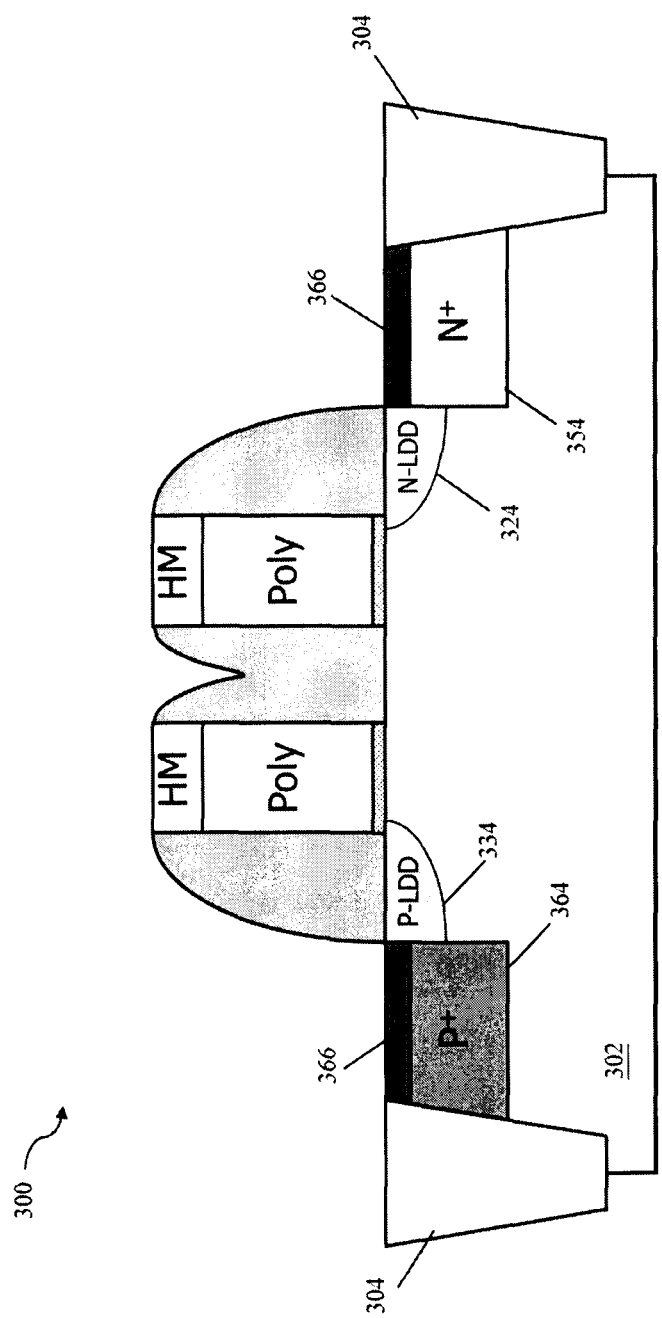

In FIG. 9, the semiconductor device 300 further includes self-aligned silicide (salicide) features 366 formed by a self-aligned silicidation (salicidation). The silicide features 366 are formed on the heavy doped regions 354, 364 to reduce contact resistance. An exemplary process to form the salicide features 366 includes depositing a metal layer over the substrate 302, performing an annealing to cause a reaction between the underlying silicon substrate and metal layer to form the silicide features 366, and etching the un-reacted metal away. It is noted that the merged sidewall spacers 342 and sidewall spacers 340a, 340b protect the underlying substrate during the salicidation process.

Figure 10:
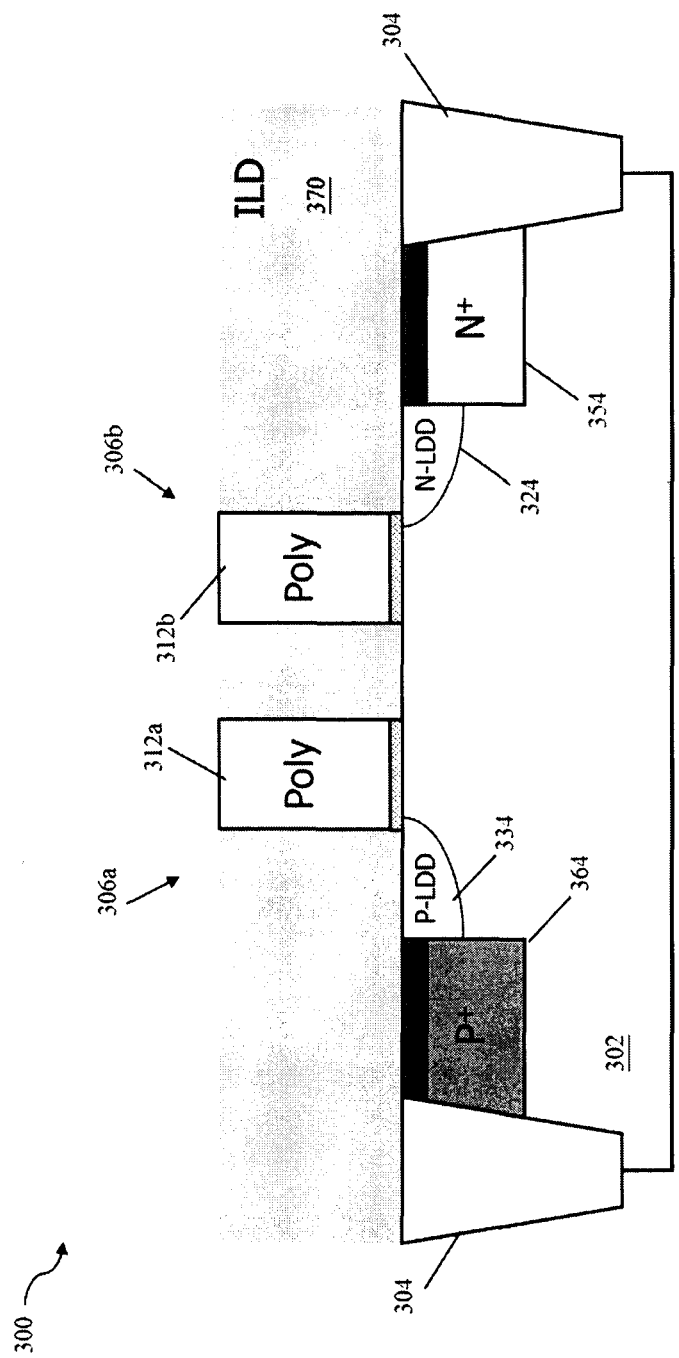

In FIG. 10, the semiconductor device 300 is shown following a chemical mechanical polishing (CMP) and etch process performed on the ILD that exposes the dummy poly gate. The semiconductor device 300 may undergo a photoresist etch back process to remove the hard masks 314*a*, 314*b* from the gate structures 306*a*, 306*b*. Additionally, an etching process may be performed to remove the spacers 340*a*, 340*b*. An inter-level dielectric (ILD) 370 is formed over the substrate 302. The ILD 370 may include a oxide formed by a high aspect ratio process (HARP) and/or high density plasma (HDP) deposition process. Thereafter, a chemical mechanical polishing (CMP) process may be performed on the ILD 370 to planarize and polish the ILD until the poly layers 312*a*, 312*b* are exposed in the gate structures 306*a*, 306*b*.

Figure 11:
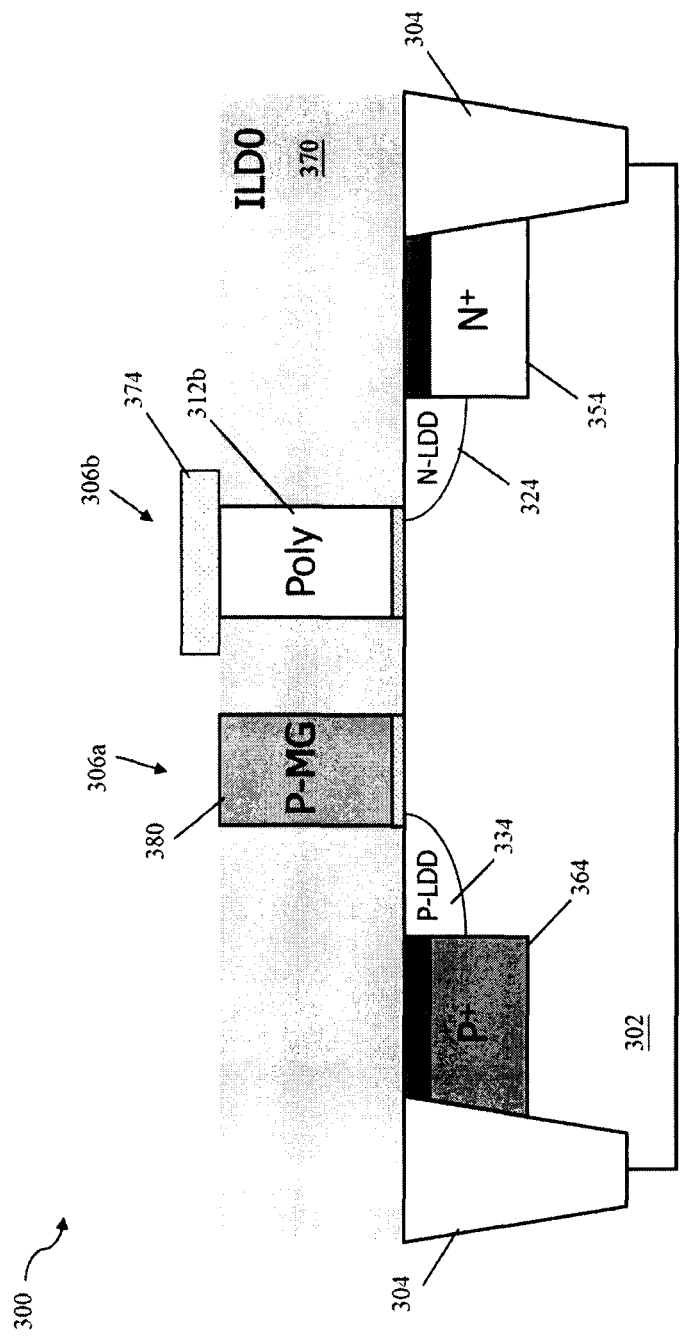

In FIG. 11, a mask 374 may be formed to protect the gate structure 306*b* by a proper lithography patterning method. The poly layer 312*a* may be removed from the gate structure 306*a* thereby forming a trench. The poly layer 312*a* may be removed by a wet or dry etch process. For example, a wet etch process may include exposure to a hydroxide containing solution (e.g., ammonium hydroxide), deionized water, and/or other suitable etchant solutions. The barrier layer (if formed in the gate first flow) may function as an etch barrier for the etching. A p-type work function metal gate (P-metal gate) 380 may be formed in the trench overlying the high-k dielectric layer 310*a*. The P-metal gate 380 may include various metal materials suitable for forming a metal gate or portion thereof, including work function layers, fill metal layer, liner layer, wetting layer, and adhesion layer. The P-metal gate 380 may be formed by ALD, PVD, CVD, or other suitable process. Further, the P-metal gate layer 380 may include a single metal layer or multi-metal layer structure with a sufficiently high effective work function (EWF) value such as TiN, TaN, Ru, Mo, Al, WN, and combinations thereof. Additionally, a fill metal may be deposited over the work function metal layer. For example, a layer of titanium (Ti) may be deposited to function as a wetting layer for a subsequent aluminum (Al) fill. A CMP may be performed to planarize the semiconductor device 300.

Figure 12:
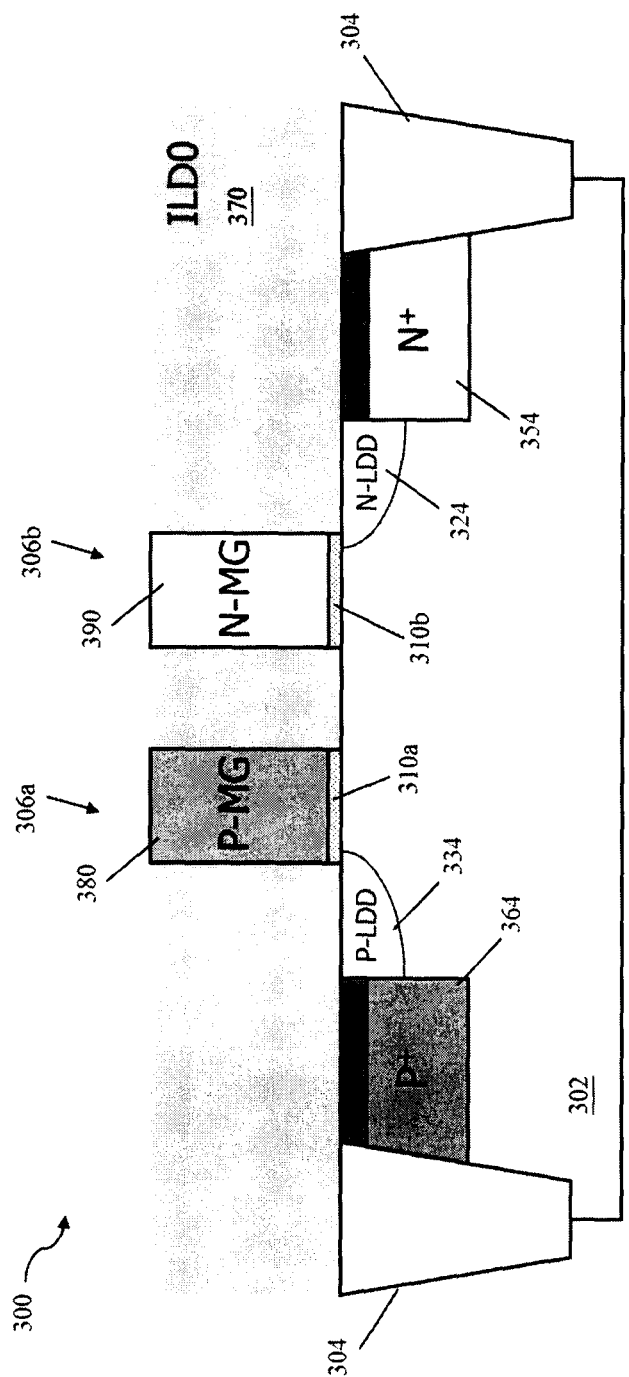

In FIG. 12, the mask 374 is removed. The poly layer 312*b* may then be removed from the gate structure 306*b* thereby forming a trench. The poly layer 312*b* may be removed by a wet or dry etch process as discussed above. It is noted that a mask is not required to protect the gate structure 306*a* since the P-metal gate 380 is present. An n-type work function metal gate (N-metal gate) 390 may be formed in the trench overlying the high-k dielectric layer 310*b*. The N-metal gate 390 may include various metal materials suitable for forming a metal gate or portion thereof, including work function layers, fill metal layer, liner layer, wetting layer, and adhesion layer. The N-metal gate 390 may be formed by ALD, PVD, CVD, or other suitable process. Further, the N-metal gate layer 390 may include a single metal layer or multi-metal layer structure with a sufficiently low EWF value such as Ti, Ag, Al, TiAlN, TaC, TaCN, TaSiN, Mn, Zr, and combinations thereof. Additionally, a fill metal may be deposited over the work function metal layer. For example, a layer of titanium (Ti) may be deposited to function as a wetting layer for a subsequent aluminum (Al) fill. A CMP may be performed to planarize the semiconductor device 300. It is understood that the semiconductor device 300 may undergo further processing to form various features such as contacts/vias, interconnect metal layers, passivation layers, etc.

Figure 13:
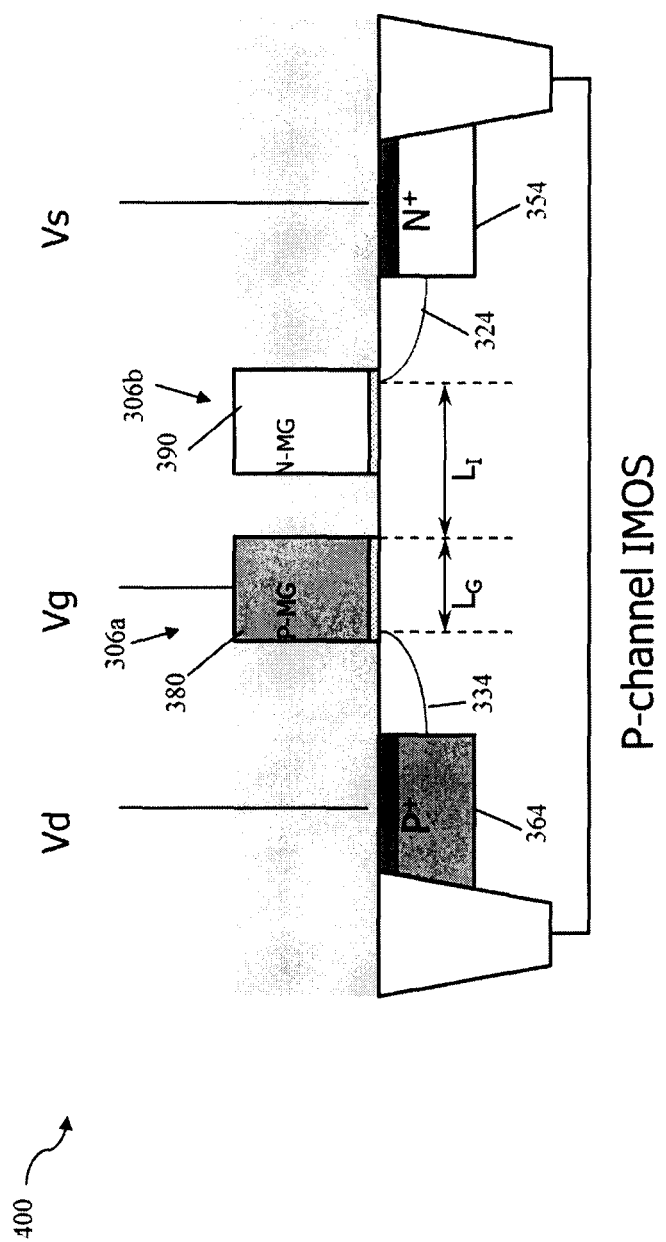
FIGS. 13 and 14 are cross-sectional views of a hybrid semiconductor device that can be implemented as a p-channel IMOS device and an n-channel IMOS device, respectively.

Referring to FIG. 13, illustrated is illustrated is a hybrid semiconductor device 400 that is operated as a p-type (p-channel) IMOS device according to an embodiment of the present disclosure. The semiconductor device 400 is similar to the semiconductor device 300 of FIG. 12. Accordingly, similar features in FIGS. 12 and 13 are numbered the same for the sake of clarity and simplicity. In the present embodiment, the semiconductor device 400 is biased such that the P-metal gate electrode 380 is coupled to a gate voltage (Vg), the n-type heavy doped region 354 is coupled to a source voltage (Vs), and the p-type heavy doped region 364 is coupled to a drain voltage (Vd). The N-metal gate electrode 390 of the gate structure 306*b* serves as a non-operational gate structure in this configuration. The semiconductor device 400 includes a channel region having a gate length ($L_G$) and an intrinsic region (I-region) having an intrinsic length ($L_I$). The operation of the semiconductor device operates in a similar manner as the IMOS device 100 of FIG. 1 except for being a reverse type of device. Additionally, FIG. 13 illustrates the semiconductor device 400 is symmetric (around a vertical line extending between the gate structures 306*a*/306*b*); thus, the semiconductor device 400 operates as a symmetric IMOS device.

Figure 14:
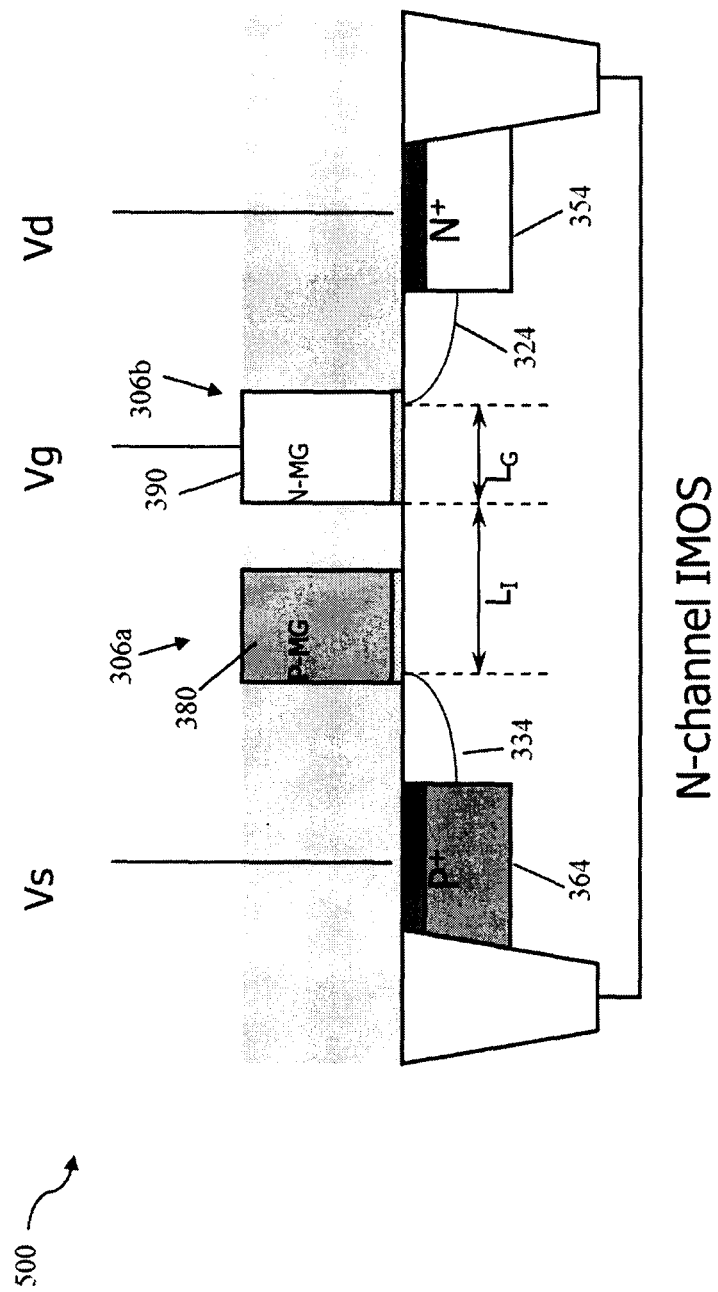

Referring to FIG. 14, illustrated is a hybrid semiconductor device 500 that is operated as an n-type (n-channel) IMOS device according to an embodiment of the present disclosure. The semiconductor device 500 is similar to the semiconductor device 300 of FIG. 12. Accordingly, similar features in FIGS. 12 and 14 are numbered the same for the sake of clarity and simplicity. In the present embodiment, the semiconductor device 500 is biased such that the N-metal gate electrode 390 is coupled to a gate voltage (Vg), the n-type heavy doped region 354 is coupled to a drain voltage (Vd), and the p-type heavy doped region 364 is coupled to a source voltage (Vs). The P-metal gate electrode 380 of the gate structure 306*a* serves as a non-operational gate structure in this configuration. The semiconductor device 400 includes an channel region having a gate length ($L_G$) and an intrinsic region (I-region) having an intrinsic length ($L_I$). The operation of the semiconductor device operates in a similar manner as the IMOS device 100 of FIG. 1. Additionally, FIG. 14 illustrates the semiconductor device 500 is symmetric (around a vertical line extending between the gate structures 306*a*/306*b*); thus, the semiconductor device 500 operates as a symmetric IMOS device.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, although the embodiments have been disclosed in a gate last process (or gate replacement process), the IMOS device may be formed in high-k dielectric last process, gate first process, and a combination gate first and gate last process.

What is claimed is:
1. A method of fabricating a semiconductor device, comprising:
   providing a semiconductor substrate having an active region;
   forming an isolation structure to isolate the active region;

forming a transistor including a first gate structure, a second gate structure, a source, and a drain, wherein the forming the transistor includes:
forming the first gate structure and the second gate structures over the active region of the semiconductor substrate, the first gate structure including a first gate electrode of a first conductivity type, the second gate structure including a second gate electrode of a second conductivity type different from the first conductivity type; and
forming a first doped region and a second doped region within the active region of the semiconductor substrate and providing the source and the drain respectively, the first doped region having the first conductivity type, the second doped region having the second conductivity type, wherein the first gate structure and the second gate structure are interposed between the first doped region and the second doped region.

2. The method of claim 1, wherein the forming the first gate structure and the second gate structure further includes:
forming a first dummy gate structure and a second dummy gate structure, wherein the first dummy gate structure is spaced apart from the second dummy gate structure by an interval;
forming a spacer on sidewalls of each of the first dummy gate structure and the second dummy gate structure, wherein the spacer of the first dummy gate structure is merged with the spacer of the second dummy gate structure at the interval;
replacing the first dummy gate structure with the first gate structure; and
replacing the second dummy gate structure with the second gate structure.

3. The method of claim 1, wherein the first conductivity type is a p-type and wherein the second conductivity type is an n-type.

4. The method of claim 3, wherein the transistor is an n-type impact-ionization metal-oxide semiconductor (IMOS) device, further comprising:
coupling the second gate structure to a gate voltage source;
coupling the first doped region to a source voltage source; and
coupling the second doped region to a drain voltage source.

5. The method of claim 3, further comprising:
wherein the transistor is a p-type IMOS device, further comprising:
coupling the first gate structure to a gate voltage source;
coupling the second doped region to a source voltage source; and
coupling the first doped region to a drain voltage source.

6. The method of claim 2, wherein the forming the first doped region and the second doped region further includes:
forming a first lightly doped region of the first conductivity type aligned with one of the sidewalls of the first dummy gate structure prior to forming the spacer;
forming a second lightly doped region of the second conductivity type aligned with one of the sidewalls of the second dummy gate structure prior to forming the spacer;
forming a first heavily doped region of the first conductivity type aligned with the spacer formed on the one of the sidewalls of the first dummy gate structure; and forming a second heavily doped region of the second conductivity type aligned with the spacer formed on the one of the sidewalls of the second dummy gate structure;
wherein the merged spacers protect a portion of the semiconductor substrate directly underlying the merged spacers during the formation of the first heavily doped region and the second heavily doped region.

7. The method of claim 6, further comprising performing a salicidation process to form silicide features on the first heavily doped region and the second heavily doped regions, respectively.

8. A method of fabricating a semiconductor device, comprising:
providing a substrate having a contiguous active region;
forming a transistor including a first gate structure, a second gate structure, a source and a drain, wherein the forming the transistor includes:
forming a first dummy gate structure and a second dummy gate structure disposed on the contiguous active region of the substrate, wherein the first dummy gate structure is spaced apart from the second dummy gate structure by an interval;
forming an inter-layer dielectric (ILD) layer on the contiguous active region and at the interval;
after the forming the ILD layer, replacing the first dummy gate structure and the second dummy gate structure with the first gate structure and the second gate structure respectively;
doping a first region of a first conductivity type and providing one of the source and the drain; and
doping a second region of a second conductivity type and providing the other of the source and the drain, wherein the first gate structure and the second gate structure are interposed between the first region and the second region.

9. The method of claim 8, wherein the doping the first region includes forming a first lightly doped region and a first heavily doped region, and wherein the forming the first lightly doped region uses a side of the first gate structure as a first alignment structure; and
wherein the doping the second region includes forming a second lightly doped region and a second heavily doped region, wherein the forming the second lightly doped region uses a side of the second gate structure as a second alignment structure.

10. The method of claim 8, further comprising:
coupling one of the first region and the second region to one of a drain voltage source and a source voltage source for the semiconductor device including the first gate structure and the second gate structure; and
coupling the other of the first region and the second region to the other of the drain voltage source and the source voltage source.

11. The method of claim 8, wherein doping the first region of the first conductivity type includes doping the first region with a p-type dopant, wherein doping the second region of the second conductivity type includes doping the second region with an n-type dopant.

12. A method of fabricating a semiconductor device, comprising:
forming a first gate structure and a second gate structure over a contiguous active region of a substrate, wherein the first gate structure is spaced apart from the second gate structure by an interval;
forming a first doped region and a second doped region within the contiguous active region of the substrate, the first doped region having a first conductivity type, the second doped region having a second conductivity type, wherein the first gate structure and the second gate structure are interposed between the first doped region and the second doped region;

operating the semiconductor device as a p-type transistor by applying a first bias configuration to the first doped region, the second doped region, and one of the first gate structure and the second gate structure; and operating the semiconductor device as an n-type transistor device by applying a second bias configuration to the first doped region, the second doped region, and the other of the first gate structure and the second gate structure.

13. The method of claim 12, wherein the forming the first gate structure and the second gate structure includes forming the first gate structure including a first gate electrode of a first conductivity type, and forming the second gate structure including a second gate electrode of a second conductivity type different from the first conductivity.

14. The method of claim 12, wherein the forming the first gate structure and the second gate structure further includes:

forming a first dummy structure and a second dummy structure;

depositing an interlayer dielectric (ILD) layer between the first dummy structure and the second dummy structure; and after the forming the ILD layer, replacing the first dummy structure with the first gate structure and replacing the second dummy structure with the second gate structure.

15. The method of claim 12, wherein the applying the first bias configuration includes:

coupling the first gate structure to a gate voltage source;

coupling the second doped region to a source voltage source; and coupling the first doped region to a drain voltage source.

16. The method of claim 12, wherein the applying the second bias configuration includes:

coupling the second gate structure to a gate voltage source;

coupling the first doped region to a source voltage source; and coupling the second doped region to a drain voltage source.

17. The method of claim 12, further comprising:

forming a dielectric layer between the first gate structure and the second gate structure, wherein the dielectric layer has a top surface coplanar with a top surface of one of the first gate structure and the second gate structure.

18. The method of claim 12, wherein the forming the first doped region includes:

doping a first portion of the first doped region aligned with a sidewall of the first gate structure;

forming a first spacer element on the first portion of the first doped region; and after the forming the first spacer element, doping a second portion of the first doped region contiguous with the first portion of the first doped region and aligned with the first spacer element.

19. The method of claim 18, wherein the forming the second doped region includes:

doping a first portion of the second doped region aligned with a sidewall of the second gate structure;

forming a second spacer element on the first portion of the second doped region; and after the forming the second spacer element, doping a second portion of the second doped region contiguous with the first portion of the second doped region and aligned with the second spacer element.

20. The method of claim 18, further comprising:

forming a first mask element on the second gate structure and at least a part of the first gate structure during the doping the first portion of the first doped region; and forming a second mask element on the second gate structure and at least a part of the first gate structure during the doping the second portion of the first doped region.

* * * * *